United States Patent
Jaeger

(10) Patent No.: US 12,176,330 B2
(45) Date of Patent: Dec. 24, 2024

(54) OPTOELECTRONIC DEVICE WITH AT LEAST ONE LIGHT CHANNEL AND METHOD FOR MANUFACTURING THE SAME

(71) Applicant: OSRAM Opto Semiconductors GmbH, Regensburg (DE)

(72) Inventor: Claus Jaeger, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 700 days.

(21) Appl. No.: 17/299,955

(22) PCT Filed: Dec. 5, 2019

(86) PCT No.: PCT/EP2019/083824
§ 371 (c)(1),
(2) Date: Jun. 4, 2021

(87) PCT Pub. No.: WO2020/115209
PCT Pub. Date: Jun. 11, 2020

(65) Prior Publication Data
US 2022/0028843 A1 Jan. 27, 2022

(30) Foreign Application Priority Data

Dec. 5, 2018 (DE) .......................... 102018131024.2

(51) Int. Cl.
*H01L 25/16* (2023.01)
*H01L 25/04* (2023.01)
(Continued)

(52) U.S. Cl.
CPC .......... *H01L 25/165* (2013.01); *H01L 25/042* (2013.01); *H01L 25/0753* (2013.01);
(Continued)

(58) Field of Classification Search
CPC . H01L 25/165; H01L 25/042; H01L 25/0753; H01L 25/167; H01L 31/0203;
(Continued)

(56) References Cited

U.S. PATENT DOCUMENTS 5,262,640 A 11/1993 Purvis et al.
8,814,378 B2 8/2014 Tang et al.
(Continued)

FOREIGN PATENT DOCUMENTS

CN 202712190 U 1/2013
CN 102959746 A 3/2013
(Continued)

*Primary Examiner* — Xia L Cross
(74) *Attorney, Agent, or Firm* — Slater Matsil, LLP

(57) ABSTRACT

In an embodiment, an optoelectronic device includes a carrier, at least one optoelectronic semiconductor component arranged on an upper side of the carrier and at least one light channel associated with the optoelectronic semiconductor component which extends between a first end of the light channel which is distant from a light-active surface of the semiconductor component and which includes an opening into the outer space and a second end of the light channel including an opening directed towards the light-active surface of the semiconductor component, wherein the at least one light channel extends between its respective first and second ends in a non-rectilinear manner, wherein the light channel includes a cavity extending between the two ends, wherein an inner wall surrounds the cavity, and wherein at least a section of the inner wall is reflective.

14 Claims, 3 Drawing Sheets

(51) Int. Cl.
*H01L 25/075* (2006.01)
*H01L 31/0203* (2014.01)
*H01L 31/0232* (2014.01)
*H01L 33/48* (2010.01)
*H01L 33/60* (2010.01)

(52) U.S. Cl.
CPC ........ *H01L 25/167* (2013.01); *H01L 31/0203* (2013.01); *H01L 31/02325* (2013.01); *H01L 33/483* (2013.01); *H01L 33/60* (2013.01)

(58) Field of Classification Search
CPC .. H01L 31/02325; H01L 33/483; H01L 33/60
USPC ........................................................ 257/82
See application file for complete search history.

(56) References Cited

U.S. PATENT DOCUMENTS

| | | |
|---|---|---|
| 10,217,915 B2 | 2/2019 | Ramchen et al. |
| 2006/0067090 A1 | 3/2006 | Lee et al. |
| 2016/0046233 A1 | 2/2016 | Hansen et al. |
| 2016/0320022 A1 | 11/2016 | Chen et al. |

FOREIGN PATENT DOCUMENTS

| | | | | |
|---|---|---|---|---|
| EP | 1630576 A2 * | 3/2006 | ............ | F21S 41/143 |
| EP | 3130950 A1 | 2/2017 | | |

* cited by examiner

OPTOELECTRONIC DEVICE WITH AT LEAST ONE LIGHT CHANNEL AND METHOD FOR MANUFACTURING THE SAME

This patent application is a national phase filing under section 371 of PCT/EP2019/083824, filed Dec. 5, 2019, which claims the priority of German patent application 102018131024.2, filed Dec. 5, 2018, each of which is incorporated herein by reference in its entirety.

TECHNICAL FIELD

The present invention relates to an optoelectronic device and a method for manufacturing an optoelectronic device.

BACKGROUND

Optoelectronic devices are known from the prior art in which an optoelectronic semiconductor component is arranged on the upper side of a carrier. The optoelectronic semiconductor component may be a light detector or a light emitter. For some applications, it may be desirable or necessary for the optoelectronic device to provide some directivity to light to be detected, provided that the optoelectronic semiconductor component is a light detector. Similarly, it may be desirable or necessary for an optoelectronic device to provide a certain directivity for light to be emitted, provided that the semiconductor optoelectronic device is a light emitter.

SUMMARY

Embodiments provide an improved optoelectronic device having sensitivity with respect to the detection of light from different solid angle ranges, or allowing radiation of light directed into a solid angle range.

An optoelectronic device according to embodiments comprises at least one optoelectronic semiconductor component, a carrier on the upper side of which the semiconductor component is arranged, and at least one light channel associated with the optoelectronic semiconductor component, which light channel extends between a first end of the light channel which is distant from a light-active surface of the semiconductor component and which comprises an opening into the outer space, and a second end of the light channel, wherein the second end of the light channel comprises an opening directed towards the light-active surface of the semiconductor component, wherein the light channel comprises a cavity extending between the two ends, wherein an inner wall surrounds the cavity, and wherein at least a section of the inner wall or the entire inner wall is designed reflective.

In the optoelectronic device, light can thus enter the light channel from the outside via the opening located at the first end of the light channel. The light can be guided along the direction of extension of the light channel by the reflective inner wall or by the reflective section of the inner wall, in particular by one or more reflections, and can be brought onto the light-active surface of the semiconductor component. Provided that the semiconductor component is a light detector, the light can be detected by the semiconductor component. Due to the reflective inner wall, at least an approximate Lambertian reception characteristic can be achieved.

If the semiconductor component is a light emitter, light emitted via the light-active surface of the semiconductor component can enter the opening at the second end of the light channel and be directed to the first end of the light channel in the cavity of the light channel, in particular by one or more reflections at the inner wall of the cavity. At the opening at the first end of the light channel, the light can enter into the outer space.

The direction to which the opening at the first end of the light channel points into the outer space essentially determines the directivity or radiation characteristic of the optoelectronic device. If the semiconductor component is a light emitter, the radiation emerging from the opening will be emitted at least mainly in the opening direction into the outer space. If the semiconductor component is a light detector, light incident on the first end of the light channel in the direction opposite to the opening direction will at least substantially reach the light-active surface of the semiconductor component by means of the cavity of the light channel. The radiation characteristic or the light characteristic of the optoelectronic device is thus dependent on the orientation of the opening of the light channel into the outer space. This can be useful, for example, if the optoelectronic device is to be used as a directional light emitter, such as in the interior of a motor vehicle, or if the optoelectronic device is to be used for light detection, such as a sun position sensor, to enable direction-dependent light detection.

In the optoelectronic device, it can be provided that at least the section of the inner wall or the entire inner wall comprises a reflective or mirror coating. This makes it easy to achieve a high reflectivity at least in the section of the inner wall.

The cavity can be filled with a light-transmitting material, for example silicone or an epoxy resin.

By light any electromagnetic radiation that can be emitted or detected by the semiconductor component, depending on whether the semiconductor component is designed as an emitter or detector can be meant here. In particular, the term light can comprise not only visible light, but also ultraviolet and/or infrared light.

The optoelectronic device can comprise at least two optical semiconductor components on the upper side of the carrier, each semiconductor component being associated with a respective, separate light channel whose opening located at the second end is directed onto the light-active surface of the respective semiconductor component and whose opening located at the first end is directed into the outer space. Thus, two or even more optoelectronic semiconductor components can be provided on the upper side of the carrier. Each semiconductor component is associated with its own light channel. Each of the light channels comprises a cavity extending between its first end and its second end, which can optionally be filled with a light-transmitting material. An inner wall surrounds the respective cavity and at least a section of the inner wall is designed to be reflective, for example by means of a reflective or mirror coating.

The optoelectronic semiconductor components may be light detectors, for example. Each light channel can direct light from the outer space onto the light-active surface of the associated semiconductor component in order to detect the light. The intensity of the detected radiation also depends on the direction in which the opening of the respective channel is directed into the outer space. If the openings of the light channels of the at least two optoelectronic semiconductor components point in different directions, the direction of incidence of the detected radiation can thus be inferred. The optoelectronic device is therefore suitable for use, for example, as a sun position sensor, for example in the interior of a motor vehicle.

When using exactly two light detectors as optoelectronic semiconductor components, it is possible to distinguish in particular in which half-space in the vehicle interior the sun is located or from which half-space the sun shines into the interior of the motor vehicle. At least one further, third light detector can also be used to determine the height of the sun and thus the position of the sun relative to the optoelectronic device in a relatively simple manner.

The optoelectronic semiconductor components can also be light emitters, such as LEDs. A mixed arrangement comprising light detectors and light emitters is also possible, with each light detector and light emitter being associated with its own light channel.

In the case of the optoelectronic device, it can be provided that the openings of the light channels pointing into the outer space are directed in different directions. This is advantageous, for example, when using the optoelectronic device as a sun sensor or as a sun position sensor. When using the optoelectronic device as a light emitter, light beams can be emitted in different directions, corresponding to the directions of the openings into the outer space.

According to one embodiment, the at least one light channel does not extend in a straight line between its respective first and second end. The light channel can thus in particular have a curved course. In this way, it can be achieved that the light-active surface of the semiconductor component is directed in a different direction than the opening of the associated light channel into the outer space. If the at least one optoelectronic semiconductor component is a light emitter, the direction of the light emission can thus be determined at least substantially by the direction of the opening into the outer space. If the optoelectronic semiconductor component is a light detector, the directionality of the detection of the incident light can be determined in the corresponding manner by the direction of the opening into the outer space. The direction in which the light-active surface of the semiconductor component points thus plays a subordinate role, since—in the case of a light detector—the light channel directs the light incident from outside onto the light-active surface or—in the case of a light emitter—the light channel directs the light emerging from the light-active surface into the outer space. By using a light channel associated with the semiconductor component, the semiconductor component can thus be arranged in the optoelectronic device in a relatively simple manner, namely on the upper side of a carrier, which may be a lead frame, for example. Also, two or more semiconductor components can be arranged on a single carrier due to the use of associated light channels.

In particular, the carrier can be flat and have a planar upper side and/or a planar bottom side. The planar upper side can in particular ensure that all semiconductor components can be arranged in one plane. A planar bottom side of the carrier can ensure that the carrier and thus the optoelectronic device can be placed on a planar surface of another device and, if necessary, be fixed. The optoelectronic device can thus be designed as an SMT component, i.e. surface mountable. SMT stands for Surface Mount Technology.

An opening of the at least one light channel pointing into the outer space can comprise a cross-sectional area which is not parallel to the light-active surface of the associated semiconductor component. This can be realized in particular by a non-rectilinear course of the light channel. The radiation or reception characteristic of the optoelectronic device is thus determined by the direction of the opening of the light channel into the outer space and not by the direction in which the light-active surface of the associated semiconductor component points.

A plane extending through the cross-sectional area of the opening into the outer space can extend at an angle between 30° and 60°, preferably between 40° and 50°, to a plane that lies in the light-active surface of the associated semiconductor component. Other angles in the range between 0° and 90° are also possible.

The cavity of the at least one and preferably each light channel can comprise a cross-section which is at least substantially dimensioned according to the dimensions of the light-active surface of the associated semiconductor component. Each cross-section extending perpendicularly to a possibly curved direction of extension of the cavity may thus have—at least substantially—the same length and width. This length and width can correspond to the length and width of the light-active surface.

If the light channel does not run in a straight line, different cross sections cannot be parallel to each other. The dimensioning of the cross-section of a cavity can remain the same along a preferably curved trajectory of the associated light channel.

The at least one semiconductor component can be fixed, in particular glued, to the surface of the carrier. This enables simple and fast mounting of the semiconductor component on the optoelectronic device.

The at least one light channel and preferably each light channel can be formed in a, in particular solid, housing block. The light channel(s) can be implemented particularly easily in a housing block. Moreover, the housing block can be manufactured compactly and with small external dimensions.

The housing block can comprise a planar bottom side so that the housing block can be applied to the upper side of the carrier. Furthermore, the housing block can be attached to the upper side of the carrier, for example by means of adhesion. The housing block can be placed on the carrier, such that the carrier closes the housing block downwardly. The housing block and the carrier can thus form the overall housing of the optoelectronic device. Both the housing block and the carrier can be designed to be compact and have small dimensions. Thus, an overall compact optoelectronic device can be realized. For example, compact component dimensions with, for example, an area of 3×5 mm for the bottom side of the carrier can be realized and a height of 3 mm for the thickness of the carrier and the overlying housing block. The optoelectronic device can be embedded in the armature of a motor vehicle interior, for example for use as a sun sensor or sun position sensor.

Embodiments also concern a method for manufacturing an optoelectronic device, in particular an optoelectronic device according to embodiments, wherein a carrier for at least one optoelectronic semiconductor component is provided, the at least one optoelectronic semiconductor component is arranged on the upper side of the carrier, and at least one light channel associated with the optoelectronic semiconductor component is arranged on the carrier, the light channel being designed or configured in such a way that the light channel extends between a first end of the light channel which is distant from a light-active surface of the semiconductor component and which comprises an opening into the outer space, and a second end of the light channel wherein the second end of the light channel comprises an opening directed towards the light-active surface of the semiconductor component, and wherein the light channel comprises a cavity extending between the two ends, which cavity can optionally be filled with a light-transmitting material, and wherein an inner wall surrounds the cavity, and wherein at least a section of the inner wall is designed to be reflective.

Embodiments also relate to a motor vehicle with at least one interior element, in particular an armature, wherein at least one device according to embodiments is integrated into the interior element, in particular below a cover which is at least partially transparent for the light to be received or emitted.

BRIEF DESCRIPTION OF THE DRAWINGS

In the following, the invention is explained in more detail with reference to the drawings by means of embodiments.

DETAILED DESCRIPTION OF ILLUSTRATIVE EMBODIMENTS

Figure 1:
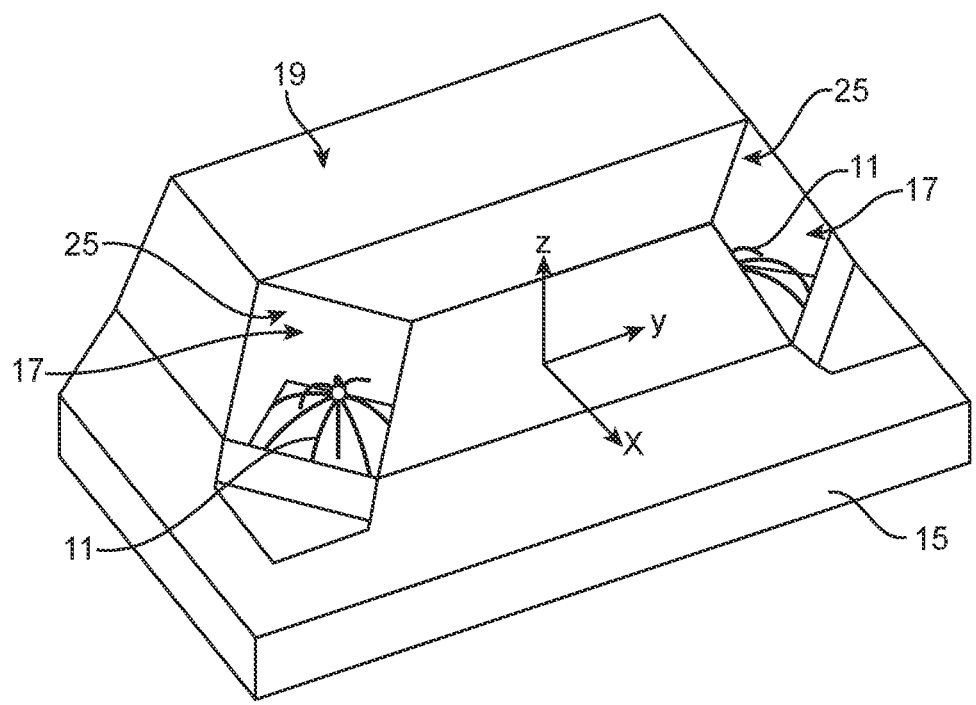
FIG. 1 shows a perspective view of a variant of an optoelectronic device according to embodiments.
Figure 2:
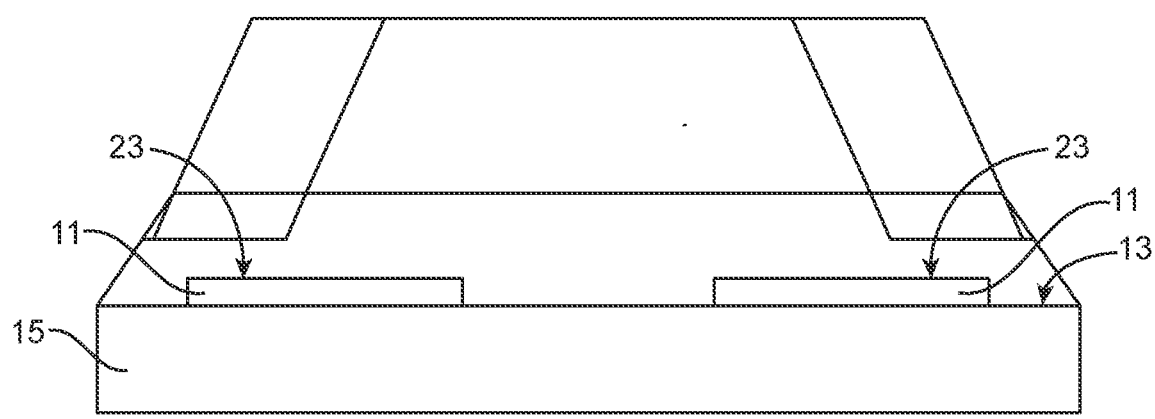
FIG. 2 shows a perspective view of a carrier of the device of FIG. 1.

The variant of an optoelectronic device according to embodiments shown in FIGS. 1 and 2 comprises two optoelectronic semiconductor components 11, which are arranged at a distance from one another on the upper side 13 of a carrier 15. Each semiconductor component 11 is associated with its own light channel 17. In the variant shown, the light channels 17 are formed in a solid housing block 19, as FIG. 1 shows.

Figure 6:
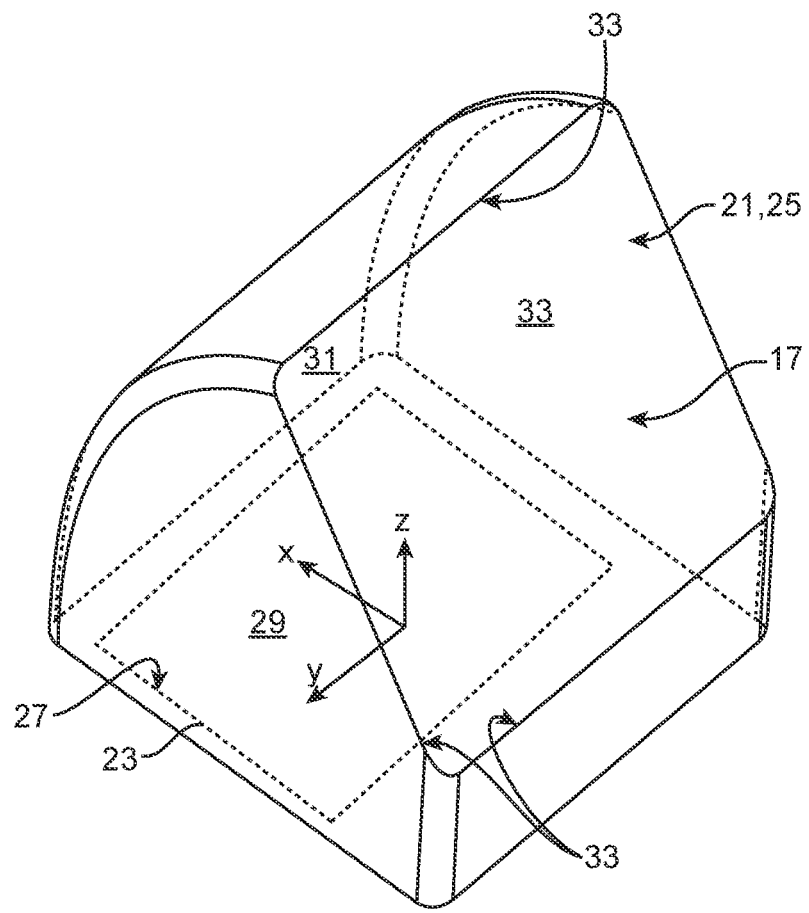
FIG. 6 shows a perspective view of a light channel of an optoelectronic device according to embodiments.

FIG. 6 illustrates an example of a light channel 17. The light channel 17 comprises a first end 21 that is distant from a light-active surface 23 of the associated semiconductor component 11 and that comprises an opening 25 to the outer space. The light channel 17 also comprises a second end 27, which comprises an opening 29 directed towards the light-active surface 23 of the semiconductor component 11. Between the two ends 21, 27 of the light channel 17 extends a cavity 31, which may optionally be filled with a light-transmitting material. The cavity 31 is surrounded by an inner wall 33, of which at least a section or the entire region of the inner wall 33 is designed reflective.

In the variant shown, the optoelectronic semiconductor components 11 are light detectors, for example in the form of a respective photodiode. Each semiconductor component 11 can thereby have a usable optical sensitivity in a predetermined spectral range for the detection of light in the spectral range.

The inner wall 33 of the cavity 31 can be designed to be reflective in such a way that there is a reflectivity of at least 75% or at least 80% or at least 85% or at least 90% or at least 95% for light from the spectral range. The percentage values refer to the proportion of the reflected radiation in relation to the incident radiation at a specific angle of incidence, which may be 90°, for example.

Such high reflectivity can be achieved in particular by at least the reflective section of the inner wall 33 comprising a reflective or mirror coating, for example of gold or silver (not shown).

Figure 3:
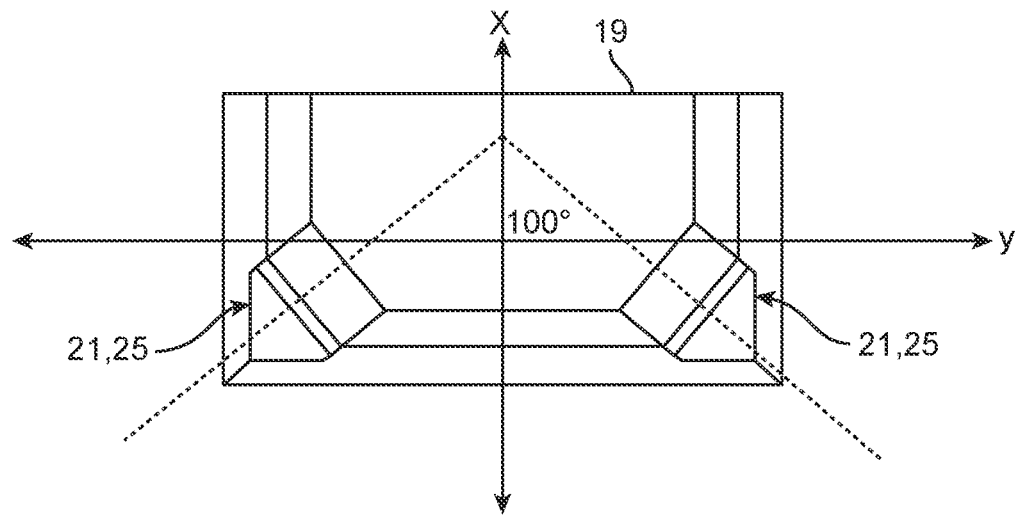
FIG. 3 shows an upper view of a housing block of the device of FIG. 1.

The optoelectronic device according to FIGS. 1 and 2 is particularly suitable for use as a 2-zone solar altitude sensor, as will be explained below. In the device of FIGS. 1 and 2, the two openings 25 point in different directions into the outer space. Here, the direction of the opening is considered to be the direction of the respective normal to a cross-sectional surface extending through the respective opening 25. As illustrated with reference to FIG. 3, the angle between the opening directions of the two openings 25 of the light channels 17 is at least approximately 100°. This angular indication refers in particular to the horizontal angle between the directions of the openings and thus of the fields of view of the detectors 11 associated with the channels 17. In other words, the horizontal angle lies in an X-Y plane parallel to the planar upper surface 13 of the carrier 15. The vertical angle of acceptance may be at least approximately 6. Thus, the opening direction may be inclined approximately 60° with respect to the Z-axis (compare the coordinate system in FIG. 1).

Figure 4:
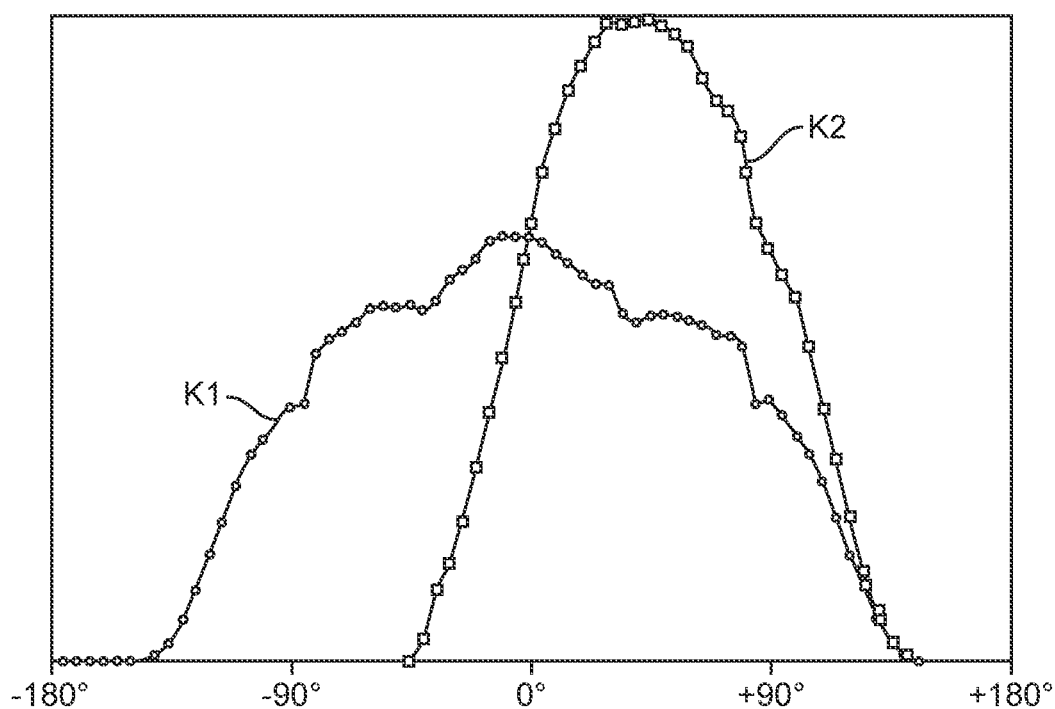
FIG. 4 shows reception characteristics of the device of FIG. 1.

FIG. 4 shows in a diagram the dependence of the measurement signal of the two semiconductor components 11 of the device of FIG. 1, each designed as a photodiode, with a changing angle of incidence of the detected radiation. Angles from −180° to +180° are plotted along the abscissa, indicating the position of a light emitter directed at the device with respect to a reference point in the device. This may be the geometric center of the device. The ordinate indicates the intensity of the detected light.

Figure 5:
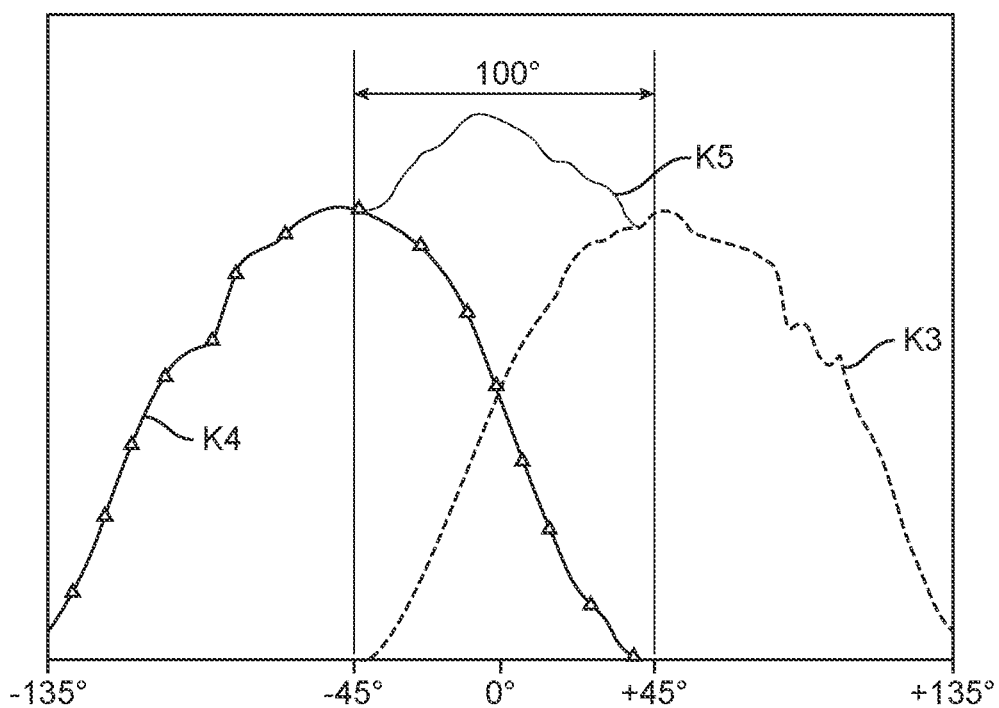
FIG. 5 shows further reception characteristics of the device of FIG. 1.

FIG. 5 shows in a diagram the dependence of a measurement signal K3, K4 of a single photodiode 11 of the device as well as a sum signal 5 of the two photodiodes 11 with changing angle of incidence of the detected radiation. Along the abscissa, angles from −135° to +135° are plotted, indicating the position of a light emitter directed at the device with respect to the reference point. The ordinate indicates the intensity of the detected light. The measurement signals K3, K4 and K5 refer to a movement of the light emitter along the y-axis (cf. FIG. 3).

The curves K3 and K4 relate to a respective signal recorded by a photodiode 11, while the curve K5 indicates the sum signal of both photodiodes 11. The sum signal corresponding to curve K5 corresponds to the measurement signal K1 in the angular range of approximately −45° and +45°.

By means of diagrams as exemplarily shown in FIGS. 4 and 5, a reception characteristic for the arrangement of the device of FIGS. 1 and 2 can be determined. When the device of FIGS. 1 and 2 is used, for example, as a sun position sensor, the reception characteristic makes it possible to determine the direction or at least the half-space from which the light is incident on the device.

If instead of photodiodes, light emitters such as LEDs are used as semiconductor components 11 in the device of FIG. 1, a device with radiation characteristics tilted to the horizontal and to the vertical is obtained. When LEDs with different colors are used, different colors can be seen at different angles. More than two semiconductor components 11 can also be provided, each with associated light channels 17. For example, if one uses four light channels 11 each rotated by 90° with associated light emitters or light detectors, the entire spatial area can be covered, for example in the horizontal direction. Mixed arrangements with light emitters and light detectors, each with an associated light channel, can also be implemented.

Although the invention has been illustrated and described in detail by means of the preferred embodiment examples, the present invention is not restricted by the disclosed examples and other variations may be derived by the skilled person without exceeding the scope of protection of the invention.

The invention claimed is:

1. An optoelectronic device comprising:
a carrier;
at least one optoelectronic semiconductor component arranged on an upper side of the carrier;
a solid housing block comprising a planar bottom side resting on the upper side of the carrier; and
at least one light channel associated with the optoelectronic semiconductor component, which extends between a first end of the light channel which is distant from a light-active surface of the semiconductor component and which comprises an opening into an outer space, and a second end of the light channel comprising an opening directed towards the light-active surface of the semiconductor component,
wherein the at least one light channel extends between its respective first and second ends in a non-rectilinear manner,
wherein the light channel comprises a cavity extending between the two ends,
wherein an inner wall surrounds the cavity,
wherein at least a section of the inner wall is reflective, and
wherein the at least one light channel is located in the solid housing block.

2. The optoelectronic device according to claim 1, wherein at least the section of the inner wall comprises a reflective or mirror coating.

3. The optoelectronic device according to claim 1, wherein at least two optoelectronic semiconductor components are arranged on the upper side of the carrier, each semiconductor component being associated with a respective, separate light channel whose opening located at the second end is directed onto the light-active surface of the semiconductor component and whose opening located at the first end is directed into the outer space.

4. The optoelectronic device according to claim 3, wherein the openings of the light channels directed into the outer space are directed in different directions.

5. The optoelectronic device according to claim 1, wherein the opening of the at least one light channel directed into the outer space comprises a cross-sectional area which does not run parallel to the light-active surface of the semiconductor component.

6. The optoelectronic device according to claim 1, wherein a plane extending through a cross-sectional area extends at an angle between 30° and 80° to a plane extending through the light-active surface of the semiconductor component.

7. The optoelectronic device according to claim 1, wherein the cavity of the at least one light channel is filled with a light-transmitting material and/or comprises a cross-section which is at least substantially dimensioned according to dimensions of the light-active surface of the semiconductor component.

8. The optoelectronic device according to claim 1, wherein a cross-section of the cavity of the at least one light channel remains at least substantially the same along a curved trajectory of the light channel.

9. The optoelectronic device according to claim 1, wherein the semiconductor component is glued to the upper side of the carrier.

10. The optoelectronic device according to claim 1, wherein the housing block is glued to the carrier.

11. The optoelectronic device according to claim 1, wherein the carrier comprises a planar upper side and/or a planar bottom side so that the optoelectronic device is surface mountable in case of the planar bottom side.

12. The optoelectronic device according to claim 1, wherein the at least one optoelectronic semiconductor component is a light detector or a light emitter, or wherein, in case of two or more semiconductor components, all semiconductor components are light detectors or light emitters, or wherein, in case of two or more semiconductor components, at least one light detector and at least one light emitter is provided.

13. A motor vehicle comprising:
at least one interior element,
wherein the optoelectronic device according to claim 1 is integrated into the interior element.

14. A method for manufacturing an optoelectronic device, the method comprising:
providing a planar carrier for at least one optoelectronic semiconductor component;
arranging the at least one optoelectronic semiconductor component on an upper side of the carrier; and
arranging at least one light channel associated with the optoelectronic semiconductor component on the carrier,
wherein the light channel is arranged such that the light channel extends between a first end of the light channel, which is distant from a light-active surface of the semiconductor component and comprises an opening into an exterior space, and a second end of the light channel,
wherein the second end of the light channel comprises an opening directed towards the light-active surface of the semiconductor component,
wherein the at least one light channel extends between its respective first and second ends in a non-rectilinear manner,
wherein the whole light channel is a cavity extending between the two ends,
wherein an inner wall surrounds the cavity, and
wherein at least a section of the inner wall is reflective.

* * * * *